United States Patent
Su et al.

(10) Patent No.: US 7,105,920 B2
(45) Date of Patent: Sep. 12, 2006

(54) SUBSTRATE DESIGN TO IMPROVE CHIP PACKAGE RELIABILITY

(75) Inventors: Chao-Yuan Su, Koahsiung (TW); Chen-Der Huang, Hsin-Chu (TW); Pei-Haw Tsao, Tai-Chung (TW); Chuen-Jye Lin, Taichung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 10/988,100

(22) Filed: Nov. 12, 2004

(65) Prior Publication Data

US 2006/0103006 A1    May 18, 2006

(51) Int. Cl.
*H01L 23/12* (2006.01)

(52) U.S. Cl. ............ 257/700; 257/703; 257/705; 257/778

(58) Field of Classification Search ........... 257/700, 257/703, 705, 778
See application file for complete search history.

(56) References Cited

U.S. PATENT DOCUMENTS

| | | | |
|---|---|---|---|
| 4,866,571 A | | 9/1989 | Butt |
| 4,965,660 A | * | 10/1990 | Ogihara et al. ............. 257/717 |
| 5,315,153 A | * | 5/1994 | Nagai et al. ................ 257/701 |
| 5,541,450 A | * | 7/1996 | Jones et al. ................ 257/697 |
| 5,614,330 A | * | 3/1997 | Panzera et al. ............. 428/697 |
| 5,952,646 A | * | 9/1999 | Spartiotis et al. ........ 250/208.1 |
| 6,358,773 B1 | | 3/2002 | Lin et al. |
| 6,528,732 B1 | | 3/2003 | Okubora et al. |
| 6,569,711 B1 | | 5/2003 | Susko et al. |
| 6,574,106 B1 | | 6/2003 | Mori |
| 6,952,049 B1 | * | 10/2005 | Ogawa et al. ............. 257/700 |
| 2004/0207059 A1 | * | 10/2004 | Hong ....................... 257/678 |
| 2005/0051893 A1 | * | 3/2005 | Kuo et al. ................. 257/734 |

* cited by examiner

*Primary Examiner*—Andy Huynh
(74) *Attorney, Agent, or Firm*—Slater & Matsil, L.L.P.

(57) ABSTRACT

A substrate design to improve chip package reliability is provided. The chip package includes a substrate having a ceramic layer formed in a recess. A die is attached to the substrate on the ceramic layer. The substrate may be attached to a printed circuit board. The substrate may be fabricated by forming a recess in a substrate, such as a multi-layer substrate formed of organic dielectric materials. A ceramic layer is then affixed to the substrate in the recess. A die may be attached to the ceramic layer and the substrate may be attached to a printed circuit board.

18 Claims, 1 Drawing Sheet

SUBSTRATE DESIGN TO IMPROVE CHIP PACKAGE RELIABILITY

TECHNICAL FIELD

The present invention relates generally to semiconductor chip design and, more specifically, to flip chip packages.

BACKGROUND

Generally, semiconductor chips used in electronic devices comprise a semiconductor die mounted on a carrier or a substrate. The semiconductor die is manufactured using standard semiconductor fabrication processes and has a series of bond pads that are used to make electrical contact to the integrated circuit formed therein. The die is placed on a carrier or substrate that has electrical leads formed therein to correspond to the bond pads of the die. Solder balls are typically used to attached the die to the substrate. The die and the carrier may be enclosed to protect the die from the environment.

The die and the substrate to which the die is mounted, however, frequently exhibit different coefficients of thermal expansion. For example, dies are commonly fabricated from silicon, which has a coefficient of thermal expansion between about 2.8 and 3.0. On the other hand, the substrates, typically made of organic dielectric materials and metal lines, have a coefficient of thermal expansion between 17.0 and 20.0. Thus, as the die and substrate are heated and cooled through normal use, the substrate expands and contracts at a much greater rate than the die. This difference in the expansion and contraction may induce serious sheer stress at the joint between the substrate and the die during temperature cycling, thereby causing the bump joints to crack. This is particularly true for high lead bumps.

One attempt at mitigating this effect involved eliminating the use of solder bumps. Rather, the substrate layers are built directly upon the die. These attempts, however, may adversely affect the yield of the die. In particular the yield of the die is tied to the yield of the substrate. Thus, if the substrate fails for any reason, the die must also be discarded.

Thus, what is needed is a method of attaching a die to a substrate to achieve a connection point that is less susceptible to the stress resulting from differing coefficients of thermal expansion.

SUMMARY OF THE INVENTION

These and other problems are generally solved or circumvented, and technical advantages are generally achieved, by embodiments of the present invention, which provides a chip package that reduces shear stress between a substrate and a die.

In an embodiment of the present invention, a chip package is provided. The chip package comprises a substrate having a ceramic die mount attached thereto. A die is then attached to the ceramic die mount.

In another embodiment of the present invention, a method of forming a chip package is provided. Specifically, a built-up substrate including a die-mount area is provided. An ceramic layer is attached to the substrate within the die-mount area. A die is mounted onto the exposed ceramic layer.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

Figure 1:
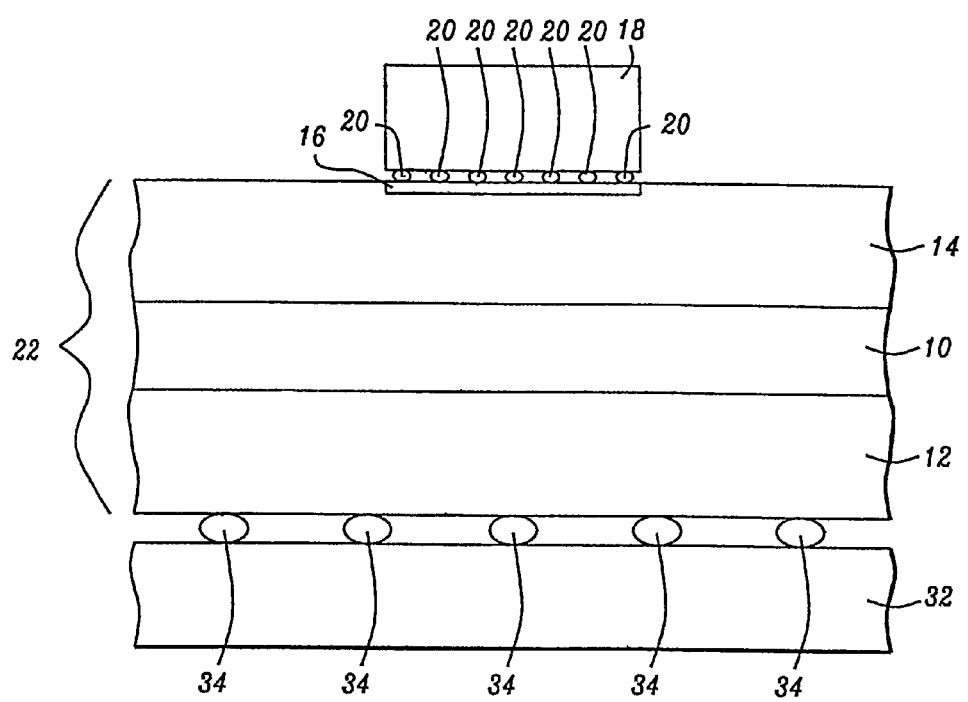
FIG. 1 schematically illustrates an embodiment of the present invention.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Generally, embodiments of the present invention involve embedding a ceramic layer into a substrate, wherein a die is subsequently mounted to the ceramic layer. The ceramic layer serves to minimize the coefficient of thermal expansion mismatch between the die and the substrate.

Referring now to FIG. 1, a portion of a packaged die is shown. The packaged die includes a substrate 22 mounted to a printed circuit board (PCB) 32 via solder bumps 34, the substrate having a die 18 mounted thereto via solder bumps 20. In an embodiment, the substrate 22 may be a multi-layer substrate, commonly referred to as a built-up substrate, comprising multiple organic dielectric layers and metal lines/vias formed therein.

For example, in an embodiment the substrate 22 includes a core layer 10 positioned between a lower sub-substrate 12 and an upper sub-substrate 14. The core layer 10 is preferably not a halogen free layer having a glass transition point (Tg) of about 185° C. as measured by a dynamic mechanical analysis (DMA) and having a Young's modulus of about 26 GPa. The core layer 10 may have a water absorption of about 0.1%. In this embodiment, the lower sub-substrate 12 and the upper sub-substrate 14 may comprise a halogen free film having a glass transition point (Tg) of about 183° C. as measured by a DMA and having a Young's modulus of about 2.4 GPa. The lower sub-substrate 12 and the upper sub-substrate 14 may exhibit a tensile strength of about 89 MPa and an elongation of about 14%. The lower sub-substrate 12 and the upper sub-substrate 14 may have a water absorption of about 1.4%.

It should be noted that the substrate discussed above is only an example of a substrate that may be used with an embodiment of the present invention. Other substrates may be used.

It should also be noted that each of the layers described above may comprise multiple layers. Furthermore, metallization lines (not shown) may be formed therein to route electrical contacts of the die 18 to specific metal contacts on the bottom of the substrate 22 (located at the solder bumps 34).

As shown in FIG. 1, a ceramic layer 16 is mounted to the substrate 22 where the die 18 is to be attached to the substrate 22. In a preferred embodiment, the ceramic layer 16 is laminated to a recessed portion of the substrate 22, preferably such that a surface of the ceramic layer 16 and the substrate 22 are coplanar. By embedding/laminating ceramic layer 16 in the substrate 22, the difference between the coefficient of thermal expansion between adjacent materials is reduced. Reducing the coefficient of thermal expansion between adjacent materials has been found to eliminate or reduce the cracking of the solder bumps due to the shear strain caused by the difference in the coefficient of thermal expansion.

For example, a die 18 may have a coefficient of thermal expansion between about 2.8 and about 3.0, and the ceramic layer 16 may have a coefficient of thermal expansion between about 3.0 to 4.0. Thus, the difference between the coefficient of thermal expansion of the die 18 and the ceramic material is less than the difference between the coefficient of thermal expansion of the substrate 22, which typically has a coefficient of thermal expansion between 17.0 to 20.0.

Solder bumps 20 and 34 are preferably comprised of eutectic lead as it has a lower melting temperature than high-lead.

Thus, advantages of embodiments of the present invention include the coefficient of thermal expansion mismatch between the build up layer and the silicon die is minimized while the coefficient of thermal expansion match is maintained with the PCB board.

The scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a chip package, comprising the steps of:
   providing a substrate having a recess;
   positioning a ceramic layer in the recess; and
   mounting a die onto the ceramic layer using solder bumps positioned between the die and the ceramic layer.

2. The method of claim 1, wherein the positioning the ceramic layer includes laminating the ceramic layer in the recess.

3. The method of claim 1, wherein the substrate comprises a built-up substrate having a core positioned between a lower built-up sub-substrate end an upper built-up sub-substrate.

4. The method of claim 1, wherein a surface of the ceramic layer and a surface of the substrate are substantially coplanar.

5. The method of claim 1, wherein the solder bumps comprise eutectic lead bumps.

6. The method of claim 1, wherein the die has a coefficient of thermal expansion from about 2.8 to about 3.0 and the ceramic layer has a coefficient of thermal expansion from about 3.0 to about 4.0.

7. The method of claim 1, further including mounting the substrate to a printed-circuit board, the substrate being mounted to the printed-circuit board on a side opposite of the die.

8. The method of claim 7, wherein the mounting the substrate to a printed circuit-board is performed by using a series of solder bumps positioned between the substrate and the printed circuit board.

9. The method of claim 8, wherein the solder bumps comprise eutectic lead bumps.

10. A chip package comprising:
    a substrate having a recess;
    a ceramic layer mounted in the recess; and
    a die mounted onto the ceramic layer using solder bumps positioned between the die and the ceramic layer.

11. The chip package of claim 10, wherein the ceramic layer is laminated to the substrate in the recess.

12. The chip package of claim 10, wherein the substrate includes a core positioned between a lower built-up sub-substrate and an upper built-up sub-substrate.

13. The chip package of claim 10, wherein a surface of the ceramic layer and a surface of the substrate are substantially coplanar.

14. The chip package of claim 10 wherein the solder bumps comprise eutectic lead bumps.

15. The chip package of claim 10, wherein the die has a coefficient of thermal expansion from about 2.8 to about 3.0 and the ceramic layer has a coefficient of thermal expansion from about 3.0 to about 4.0.

16. The chip package of claim 10, further comprising a printed circuit board mounted to the substrate, the substrate being mounted to the printed-circuit board on a side opposite the die.

17. The chip package of claim 16, wherein the printed circuit board is mounted to the substrate by a series of solder bumps positioned between the substrate and the printed circuit board.

18. The chip package of claim 17, wherein the solder bumps comprise eutectic lead bumps.

* * * * *

UNITED STATES PATENT AND TRADEMARK OFFICE
CERTIFICATE OF CORRECTION

PATENT NO.        : 7,105,920 B2  Page 1 of 1
APPLICATION NO. : 10/988100
DATED             : September 12, 2006
INVENTOR(S)       : Su et al.

It is certified that error appears in the above-identified patent and that said Letters Patent is hereby corrected as shown below:

Column 4, line 3; delete "end" insert --and--

Signed and Sealed this

Twelfth Day of December, 2006

JON W. DUDAS
*Director of the United States Patent and Trademark Office*